(12) United States Patent
Wu et al.

(10) Patent No.: US 11,251,174 B2
(45) Date of Patent: Feb. 15, 2022

(54) IMAGE SENSOR PACKAGE AND MANUFACTURING METHOD THEREOF

(71) Applicant: Industrial Technology Research Institute, Hsinchu (TW)

(72) Inventors: Sheng-Tsai Wu, Taoyuan (TW); Yu-Min Lin, Hsinchu County (TW); Yuan-Yin Lo, Hsinchu (TW); Ang-Ying Lin, Tainan (TW); Tzu-Hsuan Ni, Hsinchu (TW); Chao-Jung Chen, Hsinchu County (TW); Shin-Yi Huang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/884,051

(22) Filed: May 27, 2020

(65) Prior Publication Data
US 2021/0118860 A1 Apr. 22, 2021

Related U.S. Application Data

(60) Provisional application No. 62/924,187, filed on Oct. 22, 2019.

(30) Foreign Application Priority Data

Dec. 27, 2019 (TW) ................................. 108148199

(51) Int. Cl.
H01L 31/0203 (2014.01)
H01L 25/18 (2006.01)
H01L 23/00 (2006.01)

(52) U.S. Cl.
CPC .............. *H01L 25/18* (2013.01); *H01L 24/16* (2013.01); *H01L 31/0203* (2013.01); *H01L 2224/16145* (2013.01); *H01L 2224/16225* (2013.01)

(58) Field of Classification Search
None
See application file for complete search history.

(56) References Cited

U.S. PATENT DOCUMENTS 8,928,104 B2 * 1/2015 Tu ..................... H01L 27/14623
257/434
9,190,380 B2 11/2015 Teh et al.
(Continued)

FOREIGN PATENT DOCUMENTS

| CN | 2598144 | 1/2004 |
|----|---------|--------|
| CN | 108766956 | 11/2018 |

(Continued)

*Primary Examiner* — Hung K Vu
(74) *Attorney, Agent, or Firm* — JCIPRNET (57) ABSTRACT

An image sensor package and a manufacturing method thereof are provided. The image sensor package includes a redistribution circuit structure; an image sensing chip disposed on the redistribution circuit structure and having a sensing surface, on which a sensing area and a first conductive pillar arranged in the periphery of the sensing area are disposed; a lid covering the sensing area; an encapsulant disposed on the redistribution circuit structure and encapsulating at least part of the image sensing chip and the cover; and a top tier semiconductor chip disposed above the image sensing chip and having an active surface on which a first conductor is disposed. The first conductor overlaps the image sensing chip in a direction perpendicular to the sensing surface. The first conductive pillar and the first conductor are aligned and bonded to each other to electrically connect the image sensing chip and the top tier semiconductor chip.

16 Claims, 10 Drawing Sheets

(56) References Cited

U.S. PATENT DOCUMENTS

| | | | |
|---|---|---|---|
| 9,905,597 B2* | 2/2018 | Yang | .................... H01L 33/483 |
| 10,002,815 B2 | 6/2018 | Chou | |
| 10,199,354 B2 | 2/2019 | Modi et al. | |
| 10,217,720 B2 | 2/2019 | Wang et al. | |
| 2009/0256222 A1* | 10/2009 | Hsu | ................... H01L 27/14618 |
| | | | 257/432 |
| 2013/0248887 A1 | 9/2013 | Coffy et al. | |
| 2018/0350737 A1 | 12/2018 | Starkston et al. | |
| 2019/0074261 A1 | 3/2019 | Yu et al. | |
| 2019/0229144 A1* | 7/2019 | Kinsman | ........... H01L 27/14634 |

FOREIGN PATENT DOCUMENTS

| | | |
|---|---|---|
| TW | I559469 | 11/2016 |
| TW | 201919190 | 5/2019 |
| WO | 2017218075 | 12/2017 |

\* cited by examiner

IMAGE SENSOR PACKAGE AND MANUFACTURING METHOD THEREOF

CROSS-REFERENCE TO RELATED APPLICATION

This application claims the priority benefits of U.S. provisional application Ser. No. 62/924,187, filed on Oct. 22, 2019, and Taiwan application serial no. 108148199, filed on Dec. 27, 2019. The entirety of each of the above-mentioned patent applications is hereby incorporated by reference herein and made a part of this specification.

TECHNICAL FIELD

The disclosure relates to a semiconductor chip package and a manufacturing method thereof, and particularly relates to an image sensor package and a manufacturing method thereof.

BACKGROUND

With the advent of the digital era, image sensors become more and more common in our daily life in forms such as smart phones, digital cameras, and monitors. In order for image sensors to be thinner and lighter and achieve better performance, the current packaging technology has made an attempt to integrate the semiconductor chip into the image sensor package. However, when trying to integrate the semiconductor chip into the image sensor package, the R&D personnel often encounter the problem that the speed of signal communication between the semiconductor chip and the image sensing chip is limited, which impairs the overall performance of the image sensor.

SUMMARY

The disclosure provides an image sensor package having favorable performance.

The disclosure provides an image sensor package, including: a redistribution circuit structure; an image sensing chip disposed on the redistribution circuit structure and having a sensing surface, wherein a sensing area and a first conductive pillar are disposed on the sensing surface, and the first conductive pillar is arranged in a periphery of the sensing area; a lid covering the sensing area; an encapsulant disposed on the redistribution circuit structure and encapsulating at least part of the image sensing chip and the lid; and a top tier semiconductor chip disposed above the image sensing chip and having an active surface, wherein a first conductor is disposed on the active surface of the top tier semiconductor chip. The first conductor overlaps the image sensing chip in a direction perpendicular to the sensing surface, and the first conductive pillar and the first conductor are aligned with and bonded to each other to electrically connect the image sensing chip and the top tier semiconductor chip.

The disclosure provides an image sensor package, including: a redistribution circuit structure; a semiconductor element disposed on the redistribution circuit structure and including an image sensing chip having a sensing surface, wherein a sensing area and a first conductive pillar are disposed on the sensing surface, and the first conductive pillar is arranged in a periphery of the sensing area; a lid covering the sensing area; an encapsulant disposed on the redistribution circuit structure and encapsulating at least part of the image sensing chip and the lid; and a top tier semiconductor chip disposed above the semiconductor element and having an active surface, wherein a first conductor is disposed on the active surface of the top tier semiconductor chip. The first conductor overlaps the semiconductor element in a direction perpendicular to the sensing surface, and the first conductive pillar and the first conductor are aligned with and bonded to each other to electrically connect the semiconductor element and the top tier semiconductor chip.

The disclosure provides a manufacturing method of an image sensor package, including: disposing an image sensing chip having a sensing surface on a redistribution circuit structure, wherein a lid and a first conductive pillar are disposed on the sensing surface of the image sensing chip, and the first conductive pillar surrounds the lid on the sensing surface; disposing an encapsulant on the redistribution circuit structure to encapsulate the image sensing chip; performing a planarization process to expose the first conductive pillar and the lid from the encapsulant; and disposing a top tier semiconductor chip on the encapsulant so that a first conductor of the top tier semiconductor chip and the first conductive pillar are bonded to each other. The first conductor overlaps the image sensing chip in a direction perpendicular to the sensing surface.

Based on the above, the image sensor package of the disclosure has improved overall performance.

Several exemplary embodiments accompanied with drawings are described in detail below to further describe the disclosure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

The following describes exemplary embodiments in detail with reference to the accompanying drawings, but the embodiments provided are not intended to limit the scope of the disclosure. In addition, the drawings are provided for illustration purposes only and may not be drawn to scale. Different layers or regions may be enlarged or reduced to be displayed in a single drawing. Moreover, although terms such as "first", "second", and so on are used to describe different elements, regions, and/or components, these elements, regions, and/or components should not be limited by these terms. These terms are only used to distinguish one element, region, or component from another element, region, or component. Thus, a first element, region, or component discussed hereinafter may also be called a second element, region, or component without departing from the teachings of the embodiments. The same or similar reference numerals will be used to indicate the same or similar elements, and descriptions thereof will be omitted to avoid repetition.

In this specification, spatially relative terms such as "upper" and "lower" are defined with reference to the drawings. Therefore, it should be understood that the term "upper surface" is used interchangeably with the term "lower surface". Further, when an element such as a layer or a film is described as being disposed on another element, the element may be directly placed on another element, or there may be an intervening element between the two elements. However, when an element is described as being directly disposed on another element, there is no intervening element between the two elements. Similarly, when an element is described as being connected to another element, the element may be directly connected to another element, or there may be an intervening element between the two elements. However, when an element is described as being directly connected to another element, there is no intervening element between the two elements.

FIG. 1A to FIG. 1H are schematic cross-sectional views showing processes of manufacturing an image sensor package according to the first embodiment of the disclosure. FIG. 2 is a schematic cross-sectional view showing the image sensor package according to the first embodiment of the disclosure.

Figure 1A:
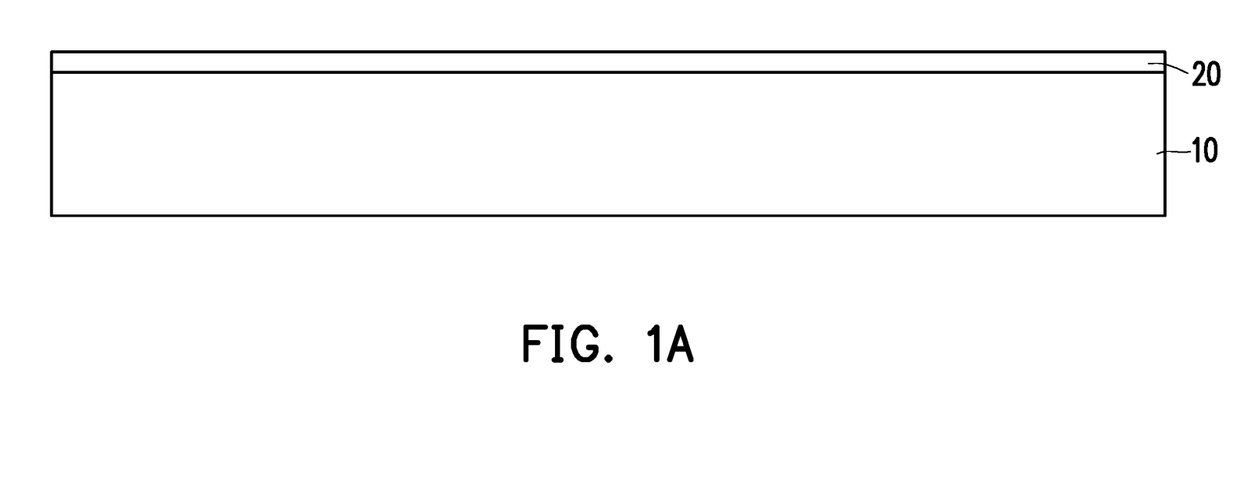
FIG. 1A to FIG. 1H are schematic cross-sectional views showing processes of manufacturing an image sensor package according to an embodiment of the disclosure.
Figure 2:
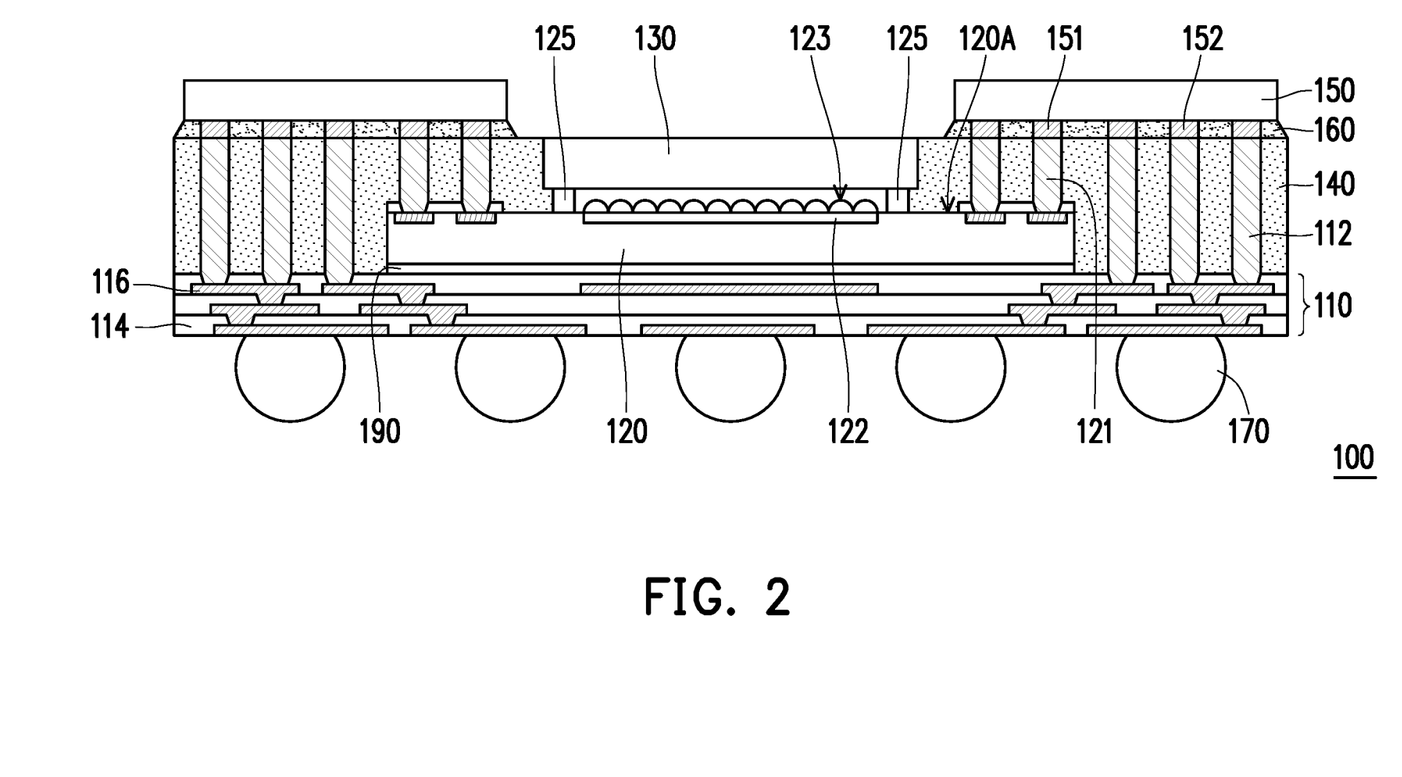
FIG. 2 is a schematic cross-sectional view showing an image sensor package according to an embodiment of the disclosure.

Referring to FIG. 1A, a carrier 10 is provided. A release film 20 is formed on the carrier 10. The carrier 10 may be a supporting substrate used in a semiconductor chip packaging process. The material of the carrier 10 may include glass, ceramic, semiconductor, etc. Although it is shown in the drawings that only an image sensor is packaged on the carrier 10, the carrier 10 may be a large-sized wafer carrier. In other words, a plurality of image sensor packages can be formed on the carrier 10 at the same time. The release film 20 may be formed of an adhesive (for example, an ultraviolet (UV) glue, a light-to-heat conversion (LTHC) glue, or other types of adhesives). Take a release film 20 formed of the UV glue as an example, the release film 20 may be irradiated with UV light to eliminate or reduce the viscosity of the release film 20, so that the carrier 10 and the release film 20 can be separated from the structure formed in the subsequent processes. Take the LTHC glue as an example, the release film 20 may be irradiated with light carrying an appropriate amount of energy to be decomposed by the thermal energy of the light and to lose or reduce viscosity, so that the carrier 10 and the release film 20 can be separated from the structure formed in the subsequent processes.

Figure 1B:
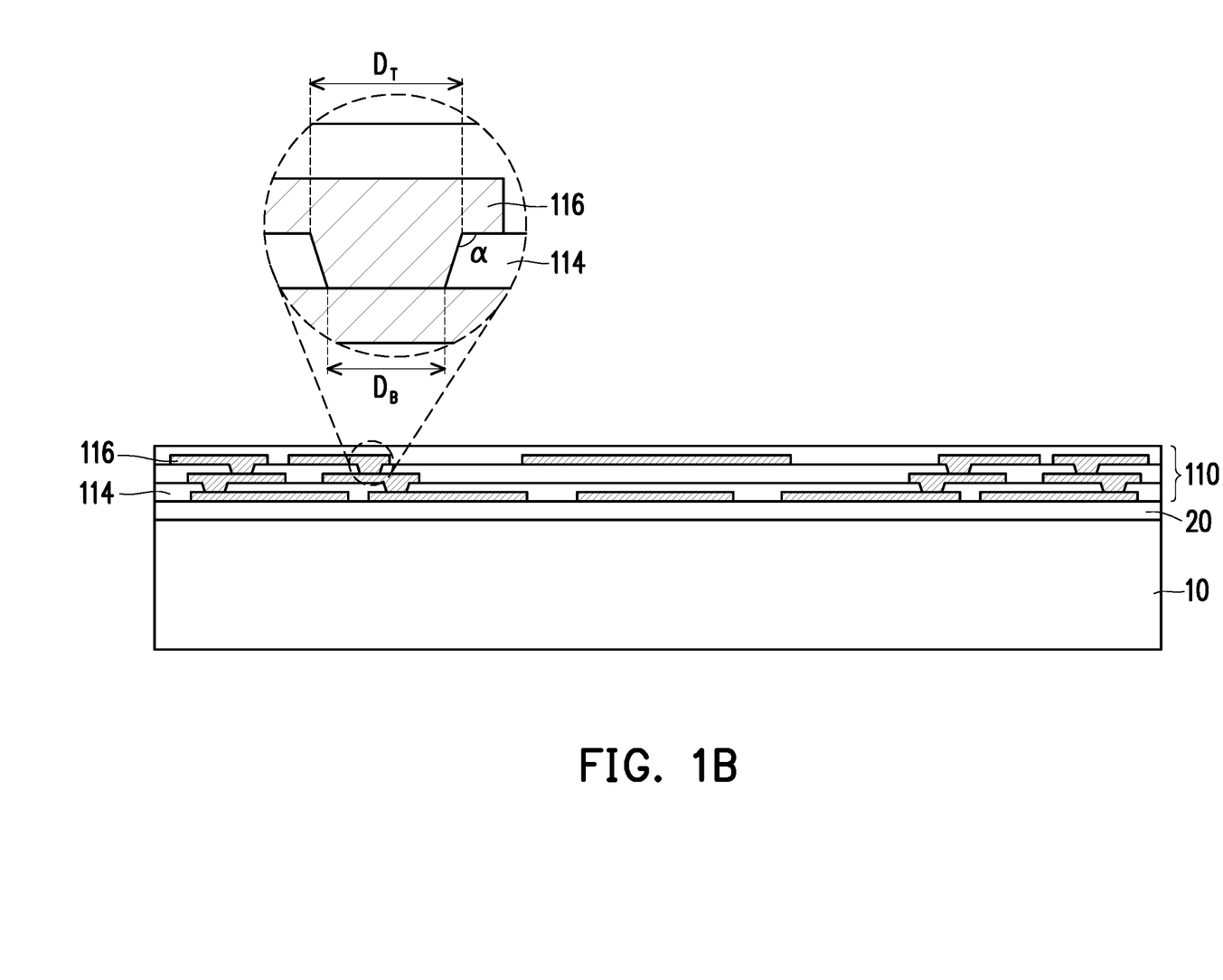

Referring to FIG. 1B, a redistribution wiring layer 116 and a dielectric layer 114 are formed on the release film 20 by thin film processes to form a redistribution circuit structure 110.

The redistribution wiring layer 116 may be formed by a build-up process. For example, the processes of forming the redistribution wiring layer 116 include the following processes. First, a seed layer is sputtered or deposited on the release film 20. The material of the seed layer may be, for example, a conductive material such as titanium/copper. Next, a patterned photoresist layer is formed on the seed layer to expose the seed layer. A conductive material is formed on the seed layer exposed by the patterned photoresist layer by an electroplating process. The conductive material may include copper (Cu), silver (Ag), palladium (Pd), aluminum (Al), nickel (Ni), titanium (Ti), gold (Au), platinum (Pt), tungsten (W), or an alloy thereof. Next, the photoresist layer and part of the seed layer not covered by the conductive material are removed to form the redistribution wiring layer 116.

A method of forming the dielectric layer 114 may include spin coating, chemical vapor deposition (CVD), plasma-enhanced chemical vapor deposition (PECVD), etc. The material of the dielectric layer 114 may include polyimide, epoxy resin, acrylic resin, phenolic resin, bismaleimide-triazine resin (BT resin), or any other suitable polymer-based dielectric materials and a silicon oxide layer, a silicon nitride layer, a silicon oxynitride layer, or other suitable silicon dielectric materials. The dielectric layer 114 may be a photosensitive insulating layer including a photosensitive insulating resin.

The redistribution circuit structure 110 may include a plurality of or one single redistribution wiring layer 116. When the redistribution circuit structure 110 includes a plurality of redistribution wiring layers 116, the processes of forming the upper redistribution wiring layer 116 include the following processes. First, an opening is formed in the dielectric layer 114 to expose the redistribution wiring layer 116 thereunder. A method of forming the opening in the dielectric layer 114 may include different processes depending on the material of the dielectric layer 114. When the dielectric layer 114 is a photosensitive insulating layer including a photosensitive insulating resin, the dielectric layer 114 may be patterned by a lithography process to form the opening. When the dielectric layer 114 is a non-photosensitive insulating layer, the dielectric layer 114 may be patterned by a lithography/etching process, a laser drilling process, or a mechanical drilling process to form the opening. Referring to the enlarged view in FIG. 1B, a top width $D_T$ of the opening formed in the dielectric layer 114 may be greater than a bottom width $D_B$. That is, an angle $\alpha$ between the tapered sidewalls of the opening and the upper surface of the dielectric layer 114 may be greater than 90°. Then, the upper redistribution wiring layer 116 is formed by a method the same as the method of forming the redistribution wiring layer 116 described above to be connected to the redistribution wiring layer 116 exposed through the opening of the dielectric layer 114. Although the drawing illustrates that the redistribution circuit structure 110 includes three dielectric layers 114 and three redistribution wiring layers 116, the disclosure is not limited thereto. The redistribution circuit structure 110 may include more or fewer dielectric layers 114 and redistribution wiring layers 116.

Figure 1C:
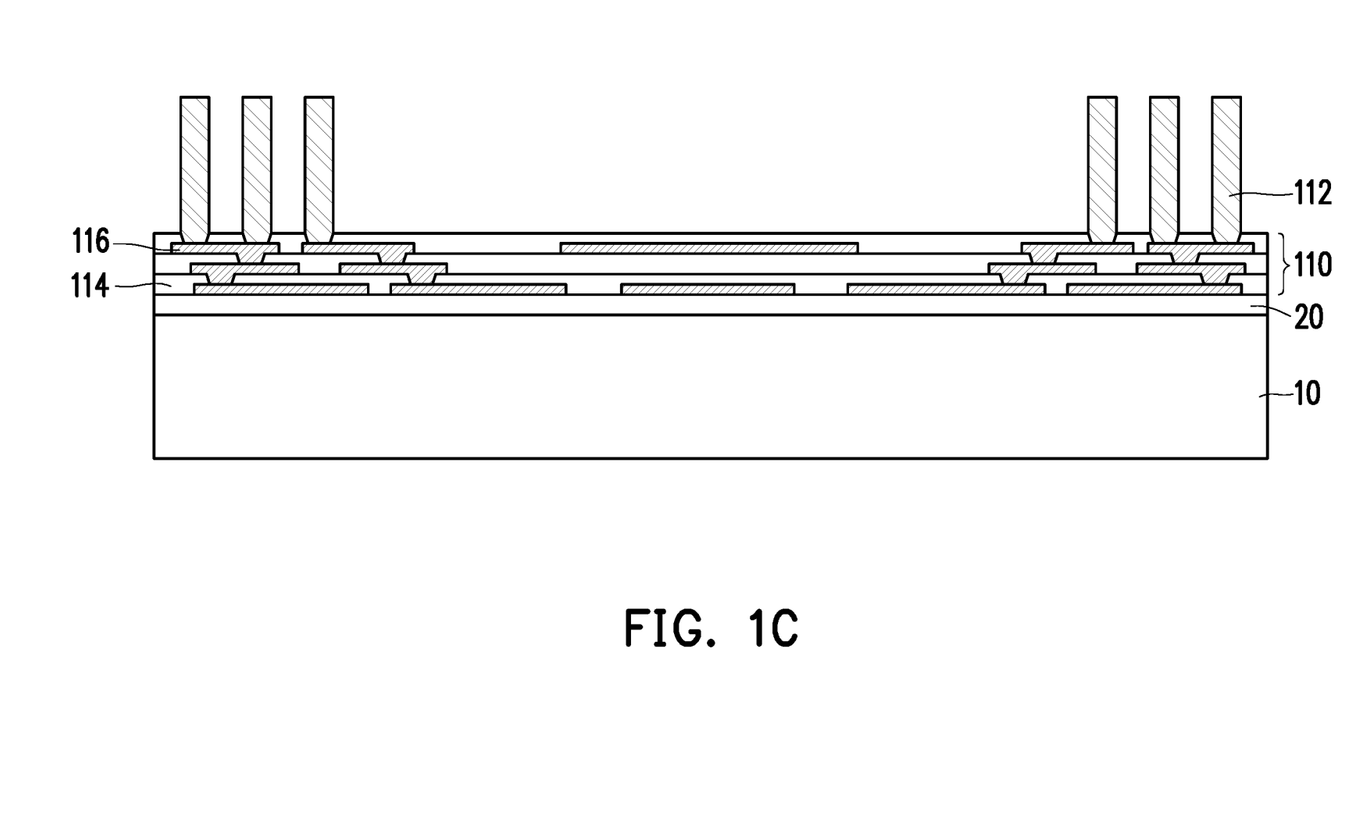

Referring to FIG. 1C, a second conductive pillar 112 may be formed on the redistribution circuit structure 110. For example, the processes of forming the second conductive pillar 112 include the following processes. First, an opening is formed in the dielectric layer 114 of the redistribution circuit structure 110 to expose the redistribution wiring layer 116. The method of forming the opening in the dielectric layer 114 may include different processes depending on the material of the dielectric layer 114. When the dielectric layer 114 is a photosensitive insulating layer including a photosensitive insulating resin, the dielectric layer 114 may be patterned by a lithography process to form the opening. When the dielectric layer 114 is a non-photosensitive insulating layer, the dielectric layer 114 may be patterned by a lithography/etching process, a laser drilling process, or a mechanical drilling process to form the opening. The top width of the opening may be greater than the bottom width. That is, the angle between the tapered sidewalls of the opening and the upper surface of the dielectric layer 114 may be greater than 90°. Thereafter, a seed layer is formed on the dielectric layer 114. A seed layer is then formed on the surfaces of the redistribution wiring layer 116 and the dielectric layer 114. The material of the seed layer may be, for example, a conductive material such as titanium/copper. Next, a patterned photoresist layer is formed on the seed layer. The patterned photoresist layer may be formed by a lithography and/or etching process. The opening of the patterned photoresist layer exposes the surface of the seed layer on the redistribution wiring layer 116. Then, a plurality of conductive pillar-shaped structures may be formed in the openings of the patterned photoresist layer. A method of forming the conductive pillar-shaped structure may be, for example, printing, electroplating, electroless plating, or a combination thereof. Thereafter, the patterned photoresist layer and part of the seed layer are removed to form the second conductive pillar 112. The material of the second conductive pillar 112 may be a metal having excellent electrical characteristics or an alloy thereof, such as copper (Cu), silver (Ag), palladium (Pd), aluminum (Al), nickel (Ni), titanium (Ti), gold (Au), platinum (Pt), tungsten (W), or an alloy thereof.

Figure 1D:
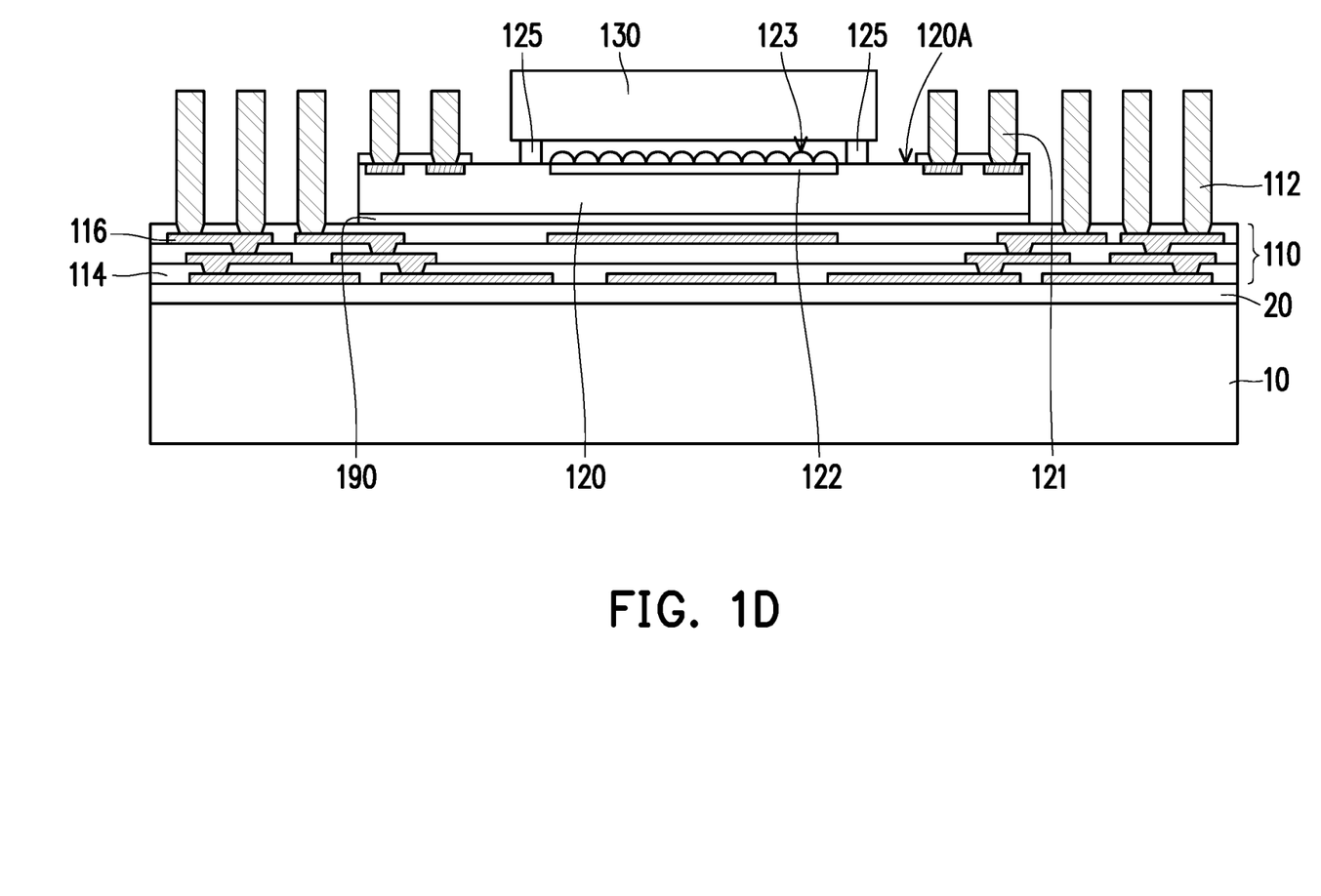

Referring to FIG. 1D, the image sensing chip 120 may be attached to the redistribution circuit structure 110 through an adhesive layer 190 such as a die attach film (DAF). The image sensing chip 120 may be a CMOS image sensing chip. However, the disclosure is not intended to limit the type of the image sensing chip 120, and the image sensing chip 120 may be other suitable types of image sensing chips. A micro lens 123 may be provided on a sensing surface 120A of the image sensing chip 120, and a sensing area 122 of the image sensing chip 120 is under the micro lens 123. The micro lens 123 is covered by a lid 130. The lid 130 may be, for example, a transparent glass substrate. A sealing structure 125 such as a sealant is formed between the lid 130 and the micro lens 123 to separate the lid 130 and the micro lens 123 from each other. In addition, the sealing structure 125 may define a space between the lid 130 and the image sensing chip 120. The image sensing chip 120 has a first conductive pillar 121, and the first conductive pillar 121 is located in the periphery of the sensing area 122 on the sensing surface 120A. The material of the first conductive pillar 121 may be a metal having excellent electrical characteristics or an alloy thereof, such as copper (Cu), silver (Ag), palladium (Pd), aluminum (Al), nickel (Ni), titanium (Ti), gold (Au), platinum (Pt), tungsten (W), or an alloy thereof.

Figure 1E:
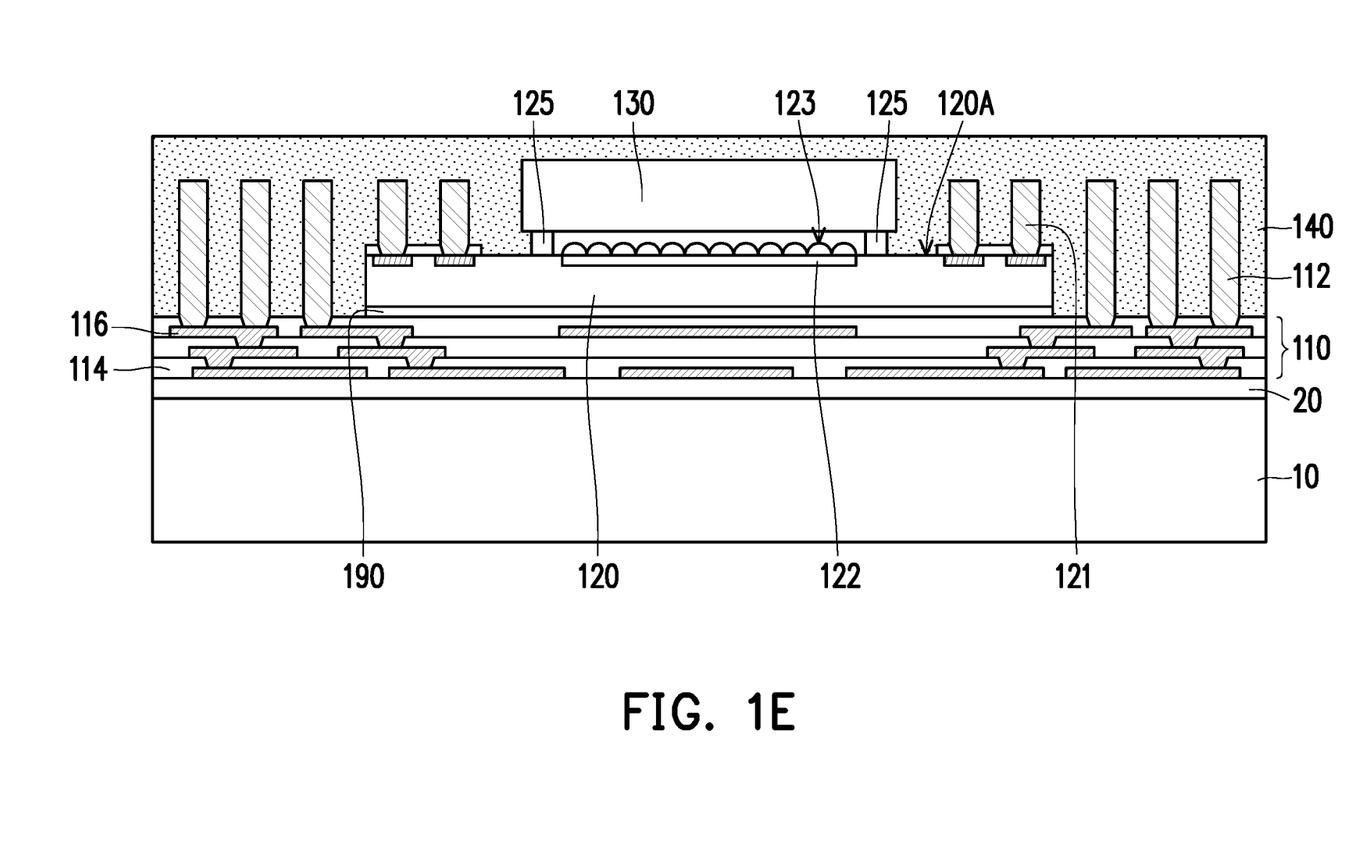
Figure 1F:
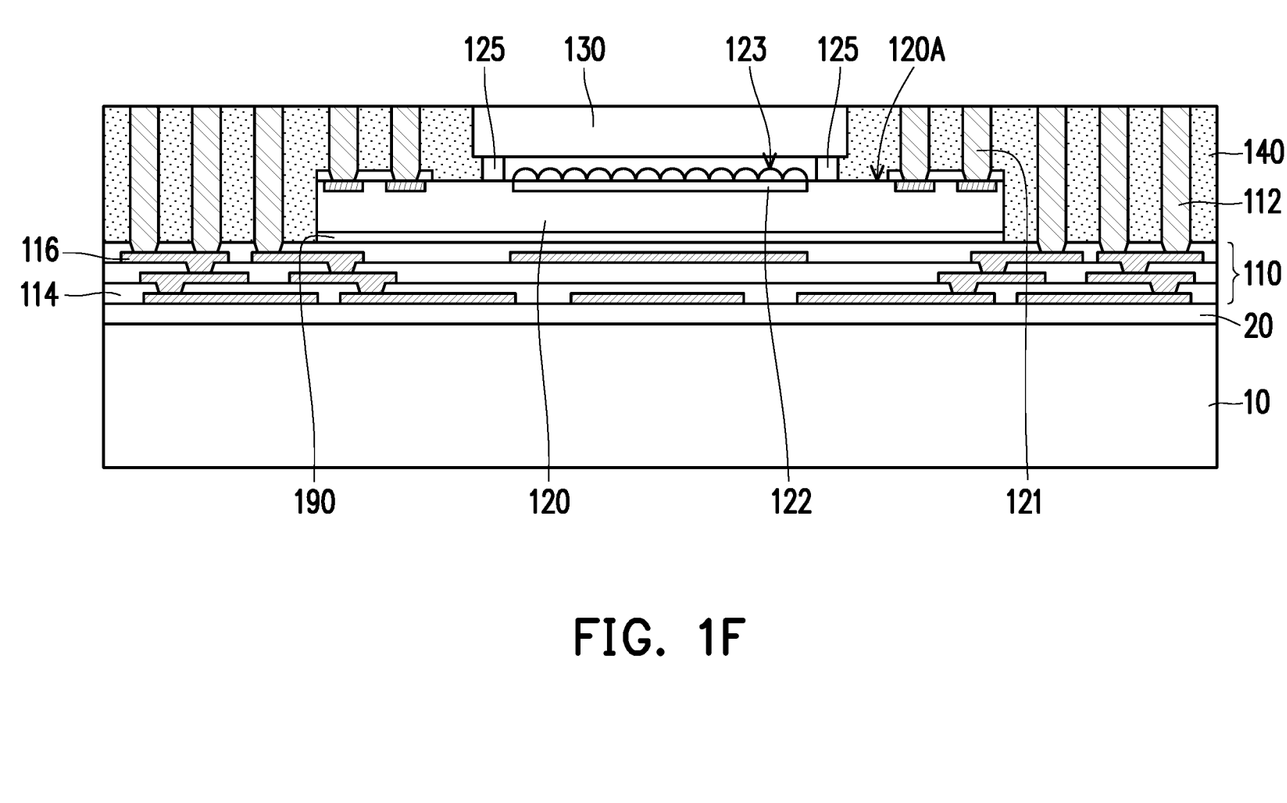

Referring to FIG. 1E and FIG. 1F, an encapsulant 140 is formed, and the encapsulant 140 encapsulates the image sensing chip 120 and the second conductive pillar 112. The material of the encapsulant 140 may include a molding compound, a molding underfill, a resin, or an epoxy molding compound (EMC). If required, the encapsulant 140 may be doped with inorganic fillers. A method of forming the encapsulant 140 includes the following processes. An encapsulating material layer covering the redistribution circuit structure 110, the image sensing chip 120, and the second conductive pillar 112 is formed on the carrier 10 by a suitable process (for example, a molding process or a deposition process), and at the same time, the sealing structure 125 may block the encapsulant 140 from entering the space between the lid 130 and the image sensing chip 120. Thereafter, a planarization process (for example, chemical mechanical polishing (CMP)) is performed to partially remove the encapsulating material layer and/or part of the first conductive pillar 121, the second conductive pillar 112, and the lid 130 until the surfaces of the first conductive pillar 121, the second conductive pillar 112, and the lid 130 are exposed. That is, the upper surfaces of the first conductive pillar 121, the second conductive pillar 112, the lid 130, and the encapsulant 140 are positioned at the same level by the planarization process. In other words, the upper surfaces of the first conductive pillar 121, the second conductive pillar 112, the lid 130, and the encapsulant 140 are coplanar. The first conductive pillar 121 and the second conductive pillar 112 may also slightly protrude from the upper surface of the encapsulant 140. The first conductive pillar 121 and the second conductive pillar 112 may also be slightly recessed from the upper surface of the encapsulant 140. In a case where the upper surfaces of the first conductive pillar 121 and the second conductive pillar 112 are slightly recessed from the upper surface of the encapsulant 140, it is easy for the first conductive pillar 121 and the second conductive pillar 112 to be aligned with and bonded to a top tier semiconductor chip 150 in the subsequent processes.

In this specification, a height of the first conductive pillar 121 refers to a vertical distance from the sensing surface 120A of the image sensing chip 120 to the upper surface of the first conductive pillar 121, and a height of the second conductive pillar 112 refers to a vertical distance from a surface of the redistribution circuit structure 110 that is adjacent to the image sensing chip 120 to the upper surface of the second conductive pillar 112. The height of the second conductive pillar 112 may be greater than the height of the first conductive pillar 121. A width of the first conductive pillar 121 and a width of the second conductive pillar 112 may be the same as each other. Alternatively, the width of the first conductive pillar 121 and the width of the second conductive pillar 112 may be different from each other. For example, the height of the first conductive pillar 121 may be 50 μm to 250 μm, and an aspect ratio of the first conductive pillar 121 may be 0.5 to 5, for example. The height of the second conductive pillar 112 may be 75 μm to 300 μm, and an aspect ratio of the second conductive pillar 112 may be 0.5 to 5, for example.

Figure 1G:
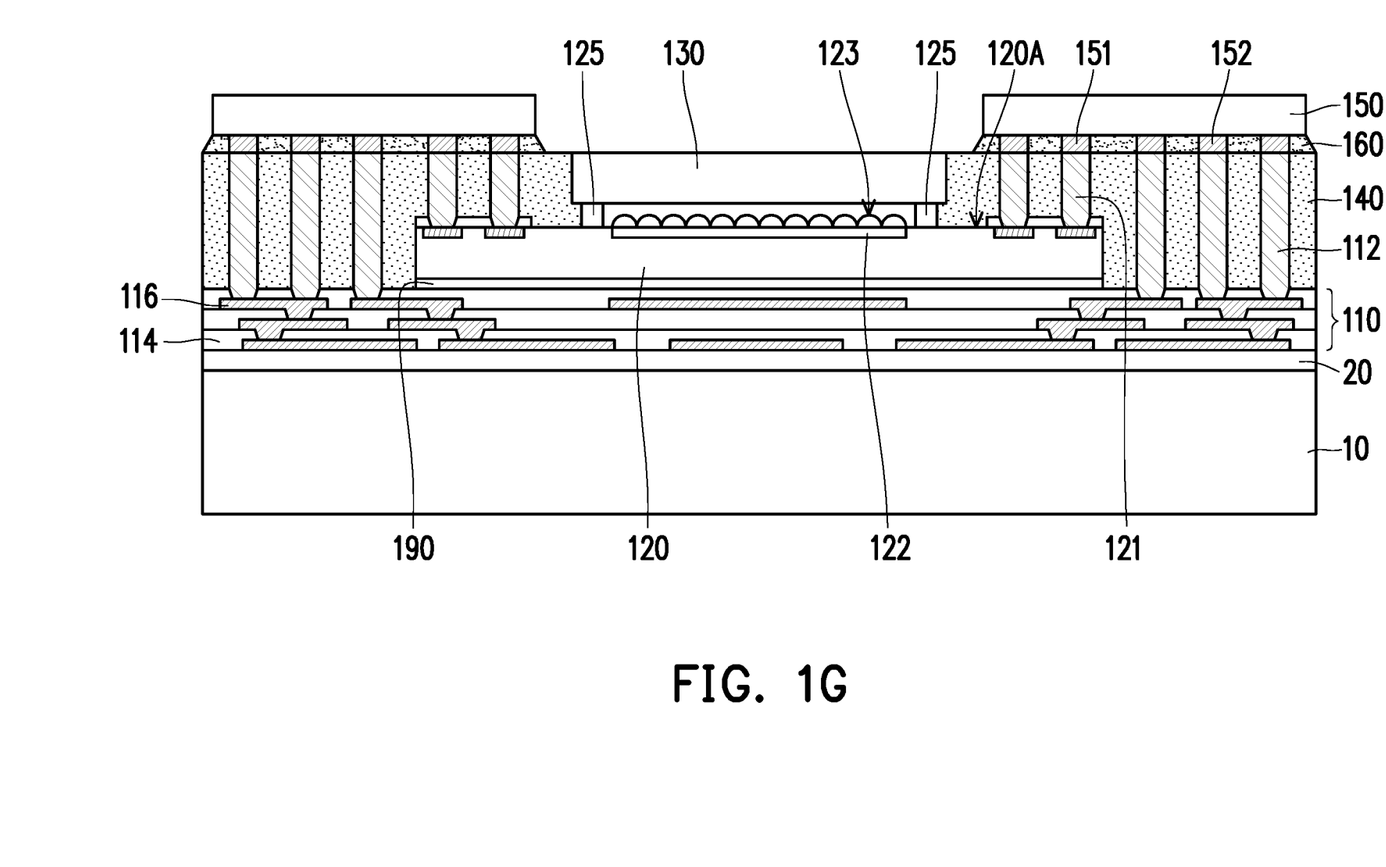

Referring to FIG. 1G, the top tier semiconductor chip 150 is provided on the encapsulant 140 so that a first conductor 151 of the top tier semiconductor chip 150 and the first conductive pillar 121 are aligned with and bonded to each other, and a second conductor 152 of the top tier semiconductor chip 150 and the second conductive pillar 112 are aligned with and bonded to each other, thereby electrically connecting the top tier semiconductor chip 150, the image sensing chip 120, and the redistribution circuit structure 110 to one another. In other words, the electrical connection between the first conductor 151 of the top tier semiconductor chip 150 and the first conductive pillar 121 and the electrical connection between the second conductor 152 of the top tier semiconductor chip 150 and the second conductive pillar 112 are realized not through the redistribution circuit structure. In such a case, the packaging process is simplified, and the electrical connection paths between the top tier semiconductor chip 150 and the first conductive pillar 121 and the second conductive pillar 112 are effectively shortened. As a result, the communication efficiency between the top tier semiconductor chip 150 and the image sensing chip 120 is further improved.

The first conductor 151 of the top tier semiconductor chip 150 overlaps the image sensing chip 120 in a direction perpendicular to the sensing surface 120A of the image sensing chip 120 while the second conductor 152 of the top tier semiconductor chip 150 does not overlap the image sensing chip 120 in the direction perpendicular to the sensing surface 120A of the image sensing chip 120. The materials of the first conductor 151 and the second conductor 152 may include a conductive material such as copper (Cu), silver (Ag), palladium (Pd), aluminum (Al), nickel (Ni), titanium (Ti), gold (Au), platinum (Pt), tungsten (W), or alloys thereof. Regarding the shape, the first conductor 151 and the second conductor 152 may each be a pillar or a stud bump. A method of bonding the first conductor 151 to the first conductive pillar 121 and bonding the second conductor 152 to the second conductive pillar 112 may include, for example, direct bonding using heat or bonding using a bonding metal. For example, a bonding metal such as a solder alloy, copper, gold, silver, indium, palladium, titanium, manganese, cobalt, or an alloy thereof may be disposed respectively between the first conductor 151 and the first conductive pillar 121 and between the second conductor 152 and the second conductive pillar 112 and heated to bond the first conductor 151 to the first conductive pillar 121 and bond the second conductor 152 to the second conductive pillar 112. The bonding of the first conductor 151 and the first conductive pillar 121 and the bonding of the second conductor 152 and the second conductive pillar 112 may also be realized without using solder. That is, the bonding of the first conductor 151 and the first conductive pillar 121 and the bonding of the second conductor 152 and the second conductive pillar 112 may be realized without using a solder alloy. In other words, the bonding surface between the first conductor 151 and the first conductive pillar 121 may be a solderless bonding surface, and the bonding surface between the second conductor 152 and the second conductive pillar 112 may also be a solderless bonding surface. The bonding metal may be a low-temperature bonding metal having a melting point of less than 200° C. For example, the low-temperature bonding metal may include twin crystal copper, twin crystal silver or other nano twin crystal materials, an indium tin alloy, a tin bismuth alloy, porous gold, or a combination thereof. Compared with the conventional solder balls or solder that requires a reflow temperature higher than or equal to 250° C., the use of a low-temperature bonding metal allows the connected structures to be stably bonded at a relatively low heating temperature (for example, at a temperature less than 200° C. or less than 150° C.), and meets the reliability requirement of electrical connection.

FIG. 1G illustrates that the image sensor package includes two top tier semiconductor chips 150, but the disclosure is not limited thereto. The image sensor package may include one single top tier semiconductor chip 150 or a plurality of top tier semiconductor chips 150 arranged side by side on the encapsulant 140. The plurality of top tier semiconductor chips 150 may be the same as one another. Alternatively, the plurality of top tier semiconductor chips 150 may be different from one another. The top tier semiconductor chip 150 may include a memory chip, an application processor chip, a logic chip, or an artificial intelligence (AI) chip.

Referring to FIG. 1G again, a primer 160 may be applied on the encapsulant 140 to encapsulate the first conductor 151 and the second conductor 152. The primer 160 may fill the space between the top tier semiconductor chip 150 and the encapsulant 140 and encapsulate the first conductor 151 and the second conductor 152. As shown in FIG. 1G, the primer 160 has tapered sidewalls, and a top width of the primer 160 is, for example, smaller than a bottom width of the primer 160. In some embodiments, the width of the primer 160 changes gradually, and the width of the primer 160 gradually decreases from one end closer to the encapsulant 140 toward the other end closer to the top tier semiconductor chip 150.

Figure 1H:
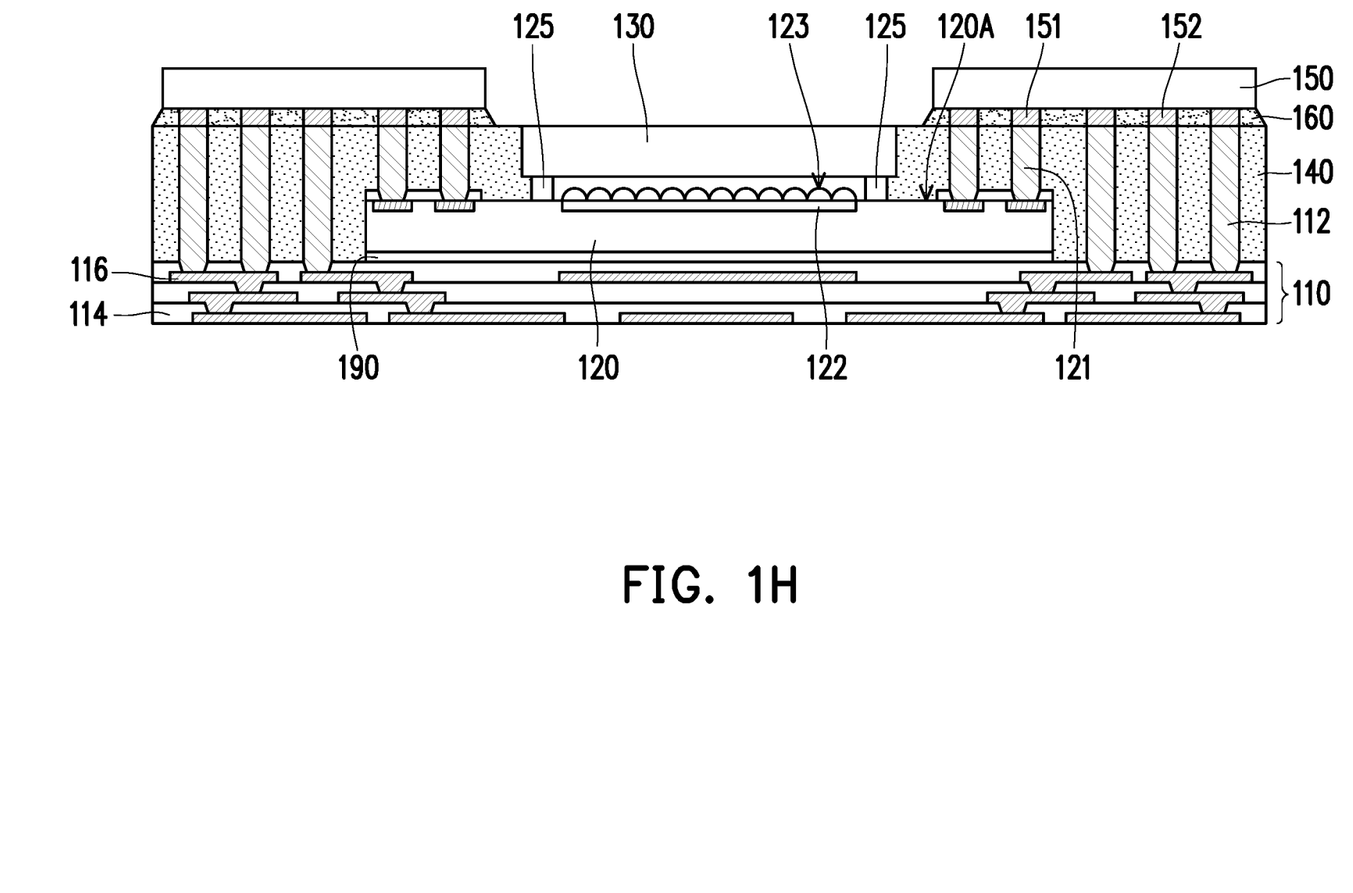

Referring to FIG. 1G and FIG. 1H, a release process is performed to separate the structure shown in FIG. 1H from the carrier 10 and the release film 20. When the release film 20 is formed of the UV glue, the release film 20 may be irradiated with UV light in the release process to eliminate or reduce the viscosity of the release film 20, so that the carrier 10 and the release film 20 can be separated from the structure shown in FIG. 1H. When the release film 20 is formed of the LTHC glue, the release film 20 may be irradiated with light carrying an appropriate amount of energy in the release process to be decomposed by the thermal energy of the light and to lose or reduce viscosity, so that the carrier 10 and the release film 20 can be separated from the structure shown in FIG. 1H.

Next, a plurality of conductive terminals 170 may be formed on the surface of the redistribution circuit structure 110, which is separated from the carrier 10 and the release film 20, to complete the image sensor package 100 of the disclosure as shown in FIG. 2. The conductive terminals 170 are, for example, solder balls, but the disclosure is not limited thereto. A plurality of image sensor packages 100 of the disclosure may be formed on a large-sized wafer at the same time, and then the image sensor packages 100 are separated from one another by a cutting process, for example. Therefore, the sidewall of the encapsulant 140 in the image sensor package 100 of the disclosure may be aligned with the sidewall of the redistribution circuit structure 110.

Referring to FIG. 2, in the image sensor package 100 of the disclosure, the image sensing chip 120 and the top tier semiconductor chip 150 are connected to each other through the first conductive pillar 121 of the image sensing chip 120 and the first conductor 151 of the top tier semiconductor chip 150. In other words, no circuit layer is disposed between the image sensing chip 120 and the top tier semiconductor chip. Since the image sensing chip 120 and the top tier semiconductor chip 150 are connected through the first conductive pillar 121 of the image sensing chip 120 and the first conductor 151 of the top tier semiconductor chip 150 instead of a circuit layer, the power and/or signal transmission path between the image sensing chip 120 and the top tier semiconductor chip 150 is shortened, and consequently the speed and quality of power and/or signal transmission are improved.

In the present embodiment, a plurality of top tier semiconductor chips 150 arranged side by side may be connected to one another through a wiring structure inside the image sensing chip 120. Generally speaking, a plurality of semiconductor chips arranged side by side are connected to one another using a circuit layer or solder wires. In a general circuit layer, the line width and the line pitch are both about 2 μm, the width of a via is about 5 μm, the width of a connection pad is about 7 μm, and the number of layers is generally three. In the wiring structure inside the image sensing chip, the line width and the line pitch are both about 0.4 μm, the width of a via is about 0.4 μm, the width of a connection pad is about 0.7 μm, and the number of layers is generally four. In other words, the wiring structure in the image sensing chip has a higher line density and a larger number of layers. In the present embodiment, the image sensing chip 120 that has a higher density and multi-layer connection capability is used for connection. Therefore, compared with using a general circuit layer for connection, the image sensor package 100 of the present embodiment achieves high-frequency signal connection.

In the present embodiment, the redistribution circuit structure 110 and the top tier semiconductor chip 150 may be connected to each other through the second conductive pillar 112 and the second conductor 152 of the top tier semiconductor chip 150. Therefore, the aspect ratio of the second conductive pillar 112 may be adjusted to provide a transmission path for other signals and a large current (for example, ground) between the redistribution circuit structure 110 and the top tier semiconductor chip 150.

In the present embodiment, the signal transmission path of the image sensing chip 120 may be connected to an external signal through the first conductive pillar 121, the top tier semiconductor chip 150, the second conductive pillar 112, the redistribution circuit structure 110, and then the conductive terminal 170. Therefore, TSV may be omitted to reduce the production cost of the image sensor package 100.

Figure 3:
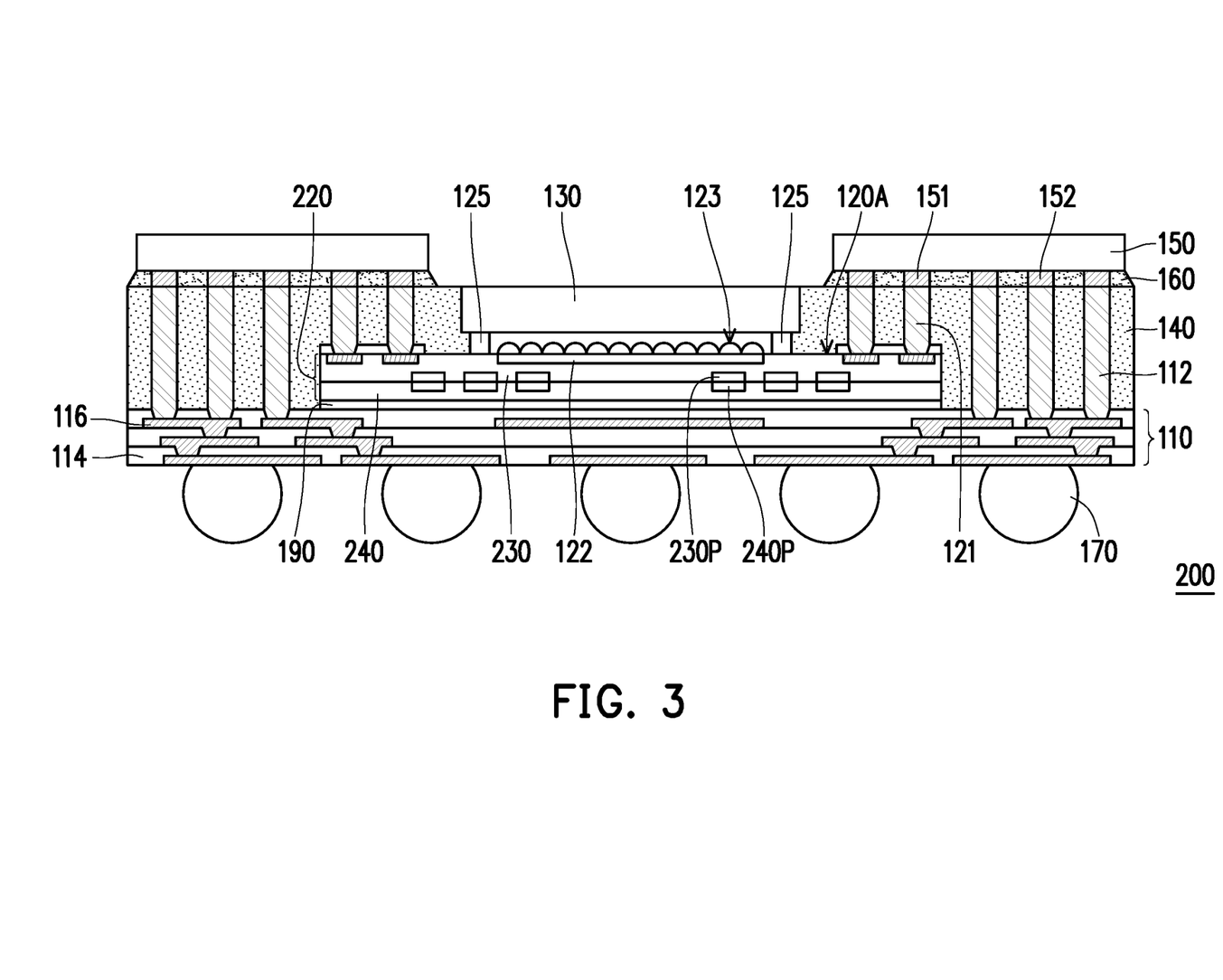
FIG. 3 is a schematic cross-sectional view showing an image sensor package according to another embodiment of the disclosure.

FIG. 3 is a schematic cross-sectional view showing an image sensor package according to another embodiment of the disclosure.

Referring to FIG. 3, the image sensor package 200 according to another embodiment of the disclosure includes a semiconductor element 220. The semiconductor element 220 may include a plurality of chips having different functions. For example, the semiconductor element 220 may include an image sensing chip 230 and a bottom tier semiconductor chip 240 stacked on top of each other. The bottom tier semiconductor chip 240 may be a memory chip, a processor chip, and/or a logic chip depending on the function of the image sensor package 200. The image sensing chip 230 and the bottom tier semiconductor chip 240 may be connected to each other through a first connection conductor 230P of the image sensing chip 230 and a second connection conductor 240P of the bottom tier semiconductor chip 240. Since the electrical path between the image sensing chip 230 and the bottom tier semiconductor chip 240 is short, fast signal transmission is achieved.

Configurations besides the above configuration have been specified in the description of the image sensor package 100 above, and therefore will not be repeated hereinafter.

In conclusion, the image sensor package of the disclosure shortens the power and/or signal transmission path in the image sensor package and improves the overall performance of the image sensor package.

Although the disclosure has been described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. An image sensor package, comprising:
a redistribution circuit structure;
an image sensing chip disposed on the redistribution circuit structure and having a sensing surface, wherein a sensing area and a first conductive pillar are disposed on the sensing surface, and the first conductive pillar is arranged in a periphery of the sensing area;
a lid covering the sensing area;
an encapsulant disposed on the redistribution circuit structure and encapsulating at least part of the image sensing chip and the lid; and
a top tier semiconductor chip disposed above the image sensing chip and having an active surface, wherein a first conductor is disposed on the active surface of the top tier semiconductor chip,
wherein the first conductor overlaps the image sensing chip in a direction perpendicular to the sensing surface, and
the first conductive pillar and the first conductor are aligned with and bonded to each other to electrically connect the image sensing chip and the top tier semiconductor chip.

2. The image sensor package according to claim 1, wherein the top tier semiconductor chip comprises a plurality of top tier semiconductor chips, and the plurality of top tier semiconductor chips are arranged side by side on the encapsulant.

3. The image sensor package according to claim 1, further comprising a second conductive pillar that penetrates the encapsulant,
wherein a second conductor is further disposed on the active surface of the top tier semiconductor chip, and the second conductor does not overlap the image sensing chip in the direction perpendicular to the sensing surface, and
the second conductive pillar and the second conductor are bonded to electrically connect the top tier semiconductor chip and the redistribution circuit structure.

4. The image sensor package according to claim 3, wherein a height of the second conductive pillar is greater than a height of the first conductive pillar.

5. The image sensor package according to claim 3, wherein a bonding surface between the first conductive pillar and the first conductor s a solderless bonding surface, and a bonding surface between the second conductive pillar and the second conductor is a solderless bonding surface.

6. The image sensor package according to claim 1, wherein the first conductive pillar and the first conductor are bonded through a bonding metal having a melting point less than 200° C.

7. The image sensor package according to claim 1, wherein the top tier semiconductor chip comprises at least one of a logic chip, a memory chip, and an AI chip.

8. The image sensor package according to claim 1, wherein a sidewall of the encapsulant is aligned with a sidewall of the redistribution circuit structure.

9. An image sensor package, comprising:
a redistribution circuit structure;
a semiconductor element disposed on the redistribution circuit structure and comprising an image sensing chip, wherein the image sensing chip has a sensing surface, a sensing area and a first conductive pillar are disposed on the sensing surface, and the first conductive pillar is arranged in a periphery of the sensing area;
a lid covering the sensing area;
an encapsulant disposed on the redistribution circuit structure and encapsulating at least part of the semiconductor element and the lid; and
a top tier semiconductor chip disposed above the semiconductor element and having an active surface, wherein a first conductor is disposed on the active surface of the top tier semiconductor chip,
wherein the first conductor overlaps the semiconductor element in a direction perpendicular to the sensing surface, and
the first conductive pillar and the first conductor are aligned with and bonded to each other to electrically connect the semiconductor element and the top tier semiconductor chip.

10. The image sensor package according to claim 9, wherein the top tier semiconductor chip comprises a plurality of top tier semiconductor chips, and the plurality of top tier semiconductor chips are arranged side by side above the semiconductor element.

11. The image sensor package according to claim 9, further comprising a second conductive pillar that penetrates the encapsulant,
- wherein a second conductor is further disposed on the active surface of the top tier semiconductor chip, and the second conductor does not overlap the semiconductor element in the direction perpendicular to the sensing surface, and
- the second conductive pillar and the second conductor are bonded to electrically connect the top tier semiconductor chip and the redistribution circuit structure.

12. The image sensor package according to claim 11, wherein a height of the second conductive pillar is greater than a height of the first conductive pillar.

13. The image sensor package according to claim 11, wherein a bonding surface between the first conductive pillar and the first conductor is a solderless bonding surface, and a bonding surface between the second conductive pillar and the second conductor is a solderless bonding surface.

14. The image sensor package according to claim 9, wherein the semiconductor element further comprises a bottom tier semiconductor chip, and the bottom tier semiconductor chip and the image sensing chip are stacked on top of each other and disposed between the redistribution circuit structure and the image sensing chip,
- the image sensing chip comprises a first connection conductor disposed on a surface of the image sensing chip opposite to the sensing surface,
- the bottom tier semiconductor chip comprises a second connection conductor disposed on a surface of the bottom tier semiconductor chip facing the image sensing chip, and
- the first connection conductor and the second connection conductor are bonded to each other to electrically connect the image sensing chip and the bottom tier semiconductor chip.

15. The image sensor package according to claim 9, wherein a sidewall of the encapsulant is aligned with a sidewall of the redistribution circuit structure.

16. The image sensor package according to claim 9, wherein the first conductive pillar and the first conductor are bonded through a bonding metal having a melting point less than 200° C.

* * * * *